(12) United States Patent
Djelassi-Tscheck et al.

(10) Patent No.: US 10,868,418 B2
(45) Date of Patent: Dec. 15, 2020

(54) ELECTRONIC SWITCH FOR ELECTRONIC FUSE

(71) Applicant: Infineon Technologies AG, Neubiberg (DE)

(72) Inventors: Christian Djelassi-Tscheck, Villach (AT); Robert Illing, Finkenstein (AT); Cosimo Lamacchia, Villach (AT); Mario Tripolt, Ferndorf (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 344 days.

(21) Appl. No.: 15/939,790

(22) Filed: Mar. 29, 2018

(65) Prior Publication Data

US 2018/0287365 A1    Oct. 4, 2018

(30) Foreign Application Priority Data

Mar. 30, 2017    (DE) .................. 10 2017 106 896

(51) Int. Cl.
*H01H 5/04*    (2006.01)
*H02H 5/04*    (2006.01)
*H02H 3/08*    (2006.01)
*H02H 3/04*    (2006.01)

(52) U.S. Cl.
CPC ............... *H02H 5/04* (2013.01); *H02H 3/04* (2013.01); *H02H 3/046* (2013.01); *H02H 3/085* (2013.01)

(58) Field of Classification Search
CPC .... H02H 1/0092; H02H 1/0007; H02H 3/085; H02H 3/10; H02H 3/006; H02H 3/08; H02H 3/021; H02H 3/04; H02H 3/046; H02H 5/04; H02H 5/041; H03K 17/0822; H03K 5/24; H03K 19/017545
See application file for complete search history.

(56) References Cited

U.S. PATENT DOCUMENTS 9,559,512 B1 *    1/2017   Bryson .................. H02H 5/042
2008/0278717 A1 *   11/2008   Makuuchi .............. G01N 21/94
                                                    356/237.4

(Continued)

FOREIGN PATENT DOCUMENTS

CN    1363141 A    8/2002
CN    1599290 A    3/2005

(Continued)

*Primary Examiner* — Alex Torres-Rivera
(74) *Attorney, Agent, or Firm* — Slater Matsil, LLP

(57) ABSTRACT

In accordance with one example, the electronic switch has a load current path operably coupled to a load via a wire; the electronic switch is configured to connect or disconnect a load current supply node and the load via the wire dependent on a drive signal. Further, the electronic fuse circuit includes a monitoring circuit configured to receive a current sense signal representing the load current passing through the wire and to determine a first protection signal based on the current sense signal and at least one wire parameter. The first protection signal is indicative of whether to disconnect the load current supply node from the load. Moreover, the electronic fuse circuit includes a logic circuit configured to receive at least one selection signal and to set the at least one wire parameter based on the at least one selection signal.

41 Claims, 9 Drawing Sheets

(56) References Cited

U.S. PATENT DOCUMENTS

| | | | |
|---|---|---|---|
| 2012/0022708 A1* | 1/2012 | Higuchi | H02H 3/085 700/293 |
| 2012/0123762 A1* | 5/2012 | Studer, II | H02H 7/226 703/14 |
| 2012/0293017 A1* | 11/2012 | Lidsky | H02H 3/087 307/126 |
| 2013/0249696 A1* | 9/2013 | Ikuta | H02H 6/005 340/593 |
| 2014/0077782 A1 | 3/2014 | Cortigiani et al. | |
| 2015/0248135 A1* | 9/2015 | Han | G05F 1/569 307/31 |
| 2017/0197566 A1* | 7/2017 | Nakamura | B60R 16/03 |
| 2018/0358800 A1* | 12/2018 | Sawano | H02H 3/20 |

FOREIGN PATENT DOCUMENTS

| | | | |
|---|---|---|---|
| CN | 101861689 A | 10/2010 | |
| DE | 10120640 A1 | 10/2002 | |
| DE | 20023615 U1 | 3/2005 | |
| DE | 112010003778 T5 | 10/2012 | |
| DE | 102014200052 A1 | 7/2015 | |
| DE | 102014214840 A1 | 2/2016 | |
| DE | 102015117849 A1 | 4/2016 | |
| EP | 1202460 A1 | 5/2002 | |
| EP | 2276135 A1 | 1/2011 | |

* cited by examiner

ELECTRONIC SWITCH FOR ELECTRONIC FUSE

This application claims the benefit of German Application No. 102017106896.1, filed on Mar. 30, 2017, which application is hereby incorporated herein by reference in its entirety.

TECHNICAL FIELD

This disclosure in general relates to aspects of an electronic switching and protection circuit, and more particularly to a drive circuit for an electronic switch.

BACKGROUND

Almost every electric installation (e.g. in an automobile, in a house, electric subsystems of larger installations) include one of more fuses to provide an over-current protection. Standard fuses include piece of wire, which provides a low-ohmic current path in case the current passing through the fuse is below a nominal current. However, the piece of wire is designed to heat up and melt or vaporize when the current passing through the fuse exceeds the nominal current for a specific time. Once triggered a fuse has to be replaced by a new one.

Fuses are increasingly replaced by circuit breakers. A circuit breaker is an automatically operated electrical switch designed to protect an electrical circuit from damage caused by overcurrent or overload or short-circuit. Circuit breakers may include electro-mechanical relays, which are triggered to disconnect the protected circuit from the supply when an over-current (i.e. a current exceeding the nominal current) is detected. In many applications (e.g. in the on-board power supply of an automobile), circuit breakers may be implemented using an electronic switch (e.g. a MOS transistor, an IGBT or the like) to disconnect the protected circuit from the supply in case of an over-current. Such electronic circuit breakers may also be referred to as electronic fuses (e-fuses or smart fuses). Besides its function as a circuit breaker, an electronic fuse may also be used to regularly switch a load on and off. Usually, the switching state (on/off) of electronic switches such as MOS transistors is controlled using so-called driver circuits or simply drivers (gate drivers in case of MOS transistors).

However, at least in some electronic circuit breakers (electronic fuses or e-fuses) common driver circuits may be inadequate with regard to fault tolerance and functional safety, which may be an issue particularly in automotive applications, in which standards concerning functional safety must be complied with (e.g. ISO 26262).

SUMMARY

An electronic fuse circuit is described herein. In accordance with one example, the electronic switch has a load current path operably coupled to a load via a wire; the electronic switch is configured to connect or disconnect a load current supply node and the load via the wire dependent on a drive signal. Further, the electronic fuse circuit includes a monitoring circuit configured to receive a current sense signal representing the load current passing through the wire and to determine a first protection signal based on the current sense signal and at least one wire parameter. The first protection signal is indicative of whether to disconnect the load current supply node from the load. Moreover, the electronic fuse circuit includes a logic circuit configured to receive the first protection signal and to generate the drive signal such that is causes the electronic switch to disconnect the load current supply node from the load, when the first protection signal indicates to block the load current supply node from the load. Thereby, the logic circuit is further configured to receive at least one selection signal and to set the at least one wire parameter based on the at least one selection signal.

In accordance with another example, the electronic switch has a load current path operably coupled to a load via a wire; the electronic switch is configured to connect or disconnect a load current supply node and the load via the wire dependent on a drive signal. Further, the electronic fuse circuit includes a monitoring circuit configured to receive a current sense signal representing the load current passing through the wire and to determine a first protection signal based on the current sense signal. The first protection signal is indicative of whether to disconnect the load current supply node from the load via the wire. Moreover, the electronic fuse circuit includes a logic circuit configured to receive the first protection signal and to generate the drive signal such that is causes the electronic switch to disconnect the load current supply node from the load, when the first protection signal indicates to disconnect the load current supply node from the load. Furthermore, the monitoring circuit is further configured to providing a pre-warning signal indicative of an imminent disconnection of the load current supply node from the load.

Moreover, a method for operating an electronic switch is described. According to one example, the method includes using the electronic switch to provide current from a load current supply node to a load via a wire, receiving at least one selection signal and setting at least one wire parameter based on the at least one selection signal, and sensing a load current passing through the wire and providing a respective current sense signal. The method further includes determining a first protection signal based on the current sense signal and the at least one wire parameter. The first protection signal is indicative of whether to disconnect the load current supply node from the load. When the first protection signal indicates to disconnect the load current supply node from the load, a drive signal is generated for the electronic switch to cause the electronic switch to disconnect the load current supply node from the load.

According to another example, the method includes using the electronic switch to provide current from a load current supply node to a load via a wire, sensing a load current passing through the wire and providing a respective current sense signal, and determining a first protection signal based on the current sense signal. The first protection signal is indicative of whether to disconnect the load current supply node from the load. Furthermore, a pre-warning signal indicative of an imminent disconnection of the load current supply node from the load is provided. When the first protection signal indicates to disconnect the load current supply node from the load, a drive signal for the electronic switch is generated to cause the electronic switch to disconnect the load current supply node from the load.

BRIEF DESCRIPTION OF THE DRAWINGS

The invention can be better understood with reference to the following description and drawings. The components in the figures are not necessarily to scale, emphasis instead being placed upon illustrating the principles of the invention. Moreover, in the figures, like reference numerals designate corresponding parts. In the drawings.

DETAILED DESCRIPTION OF ILLUSTRATIVE EMBODIMENTS

Figure 1:
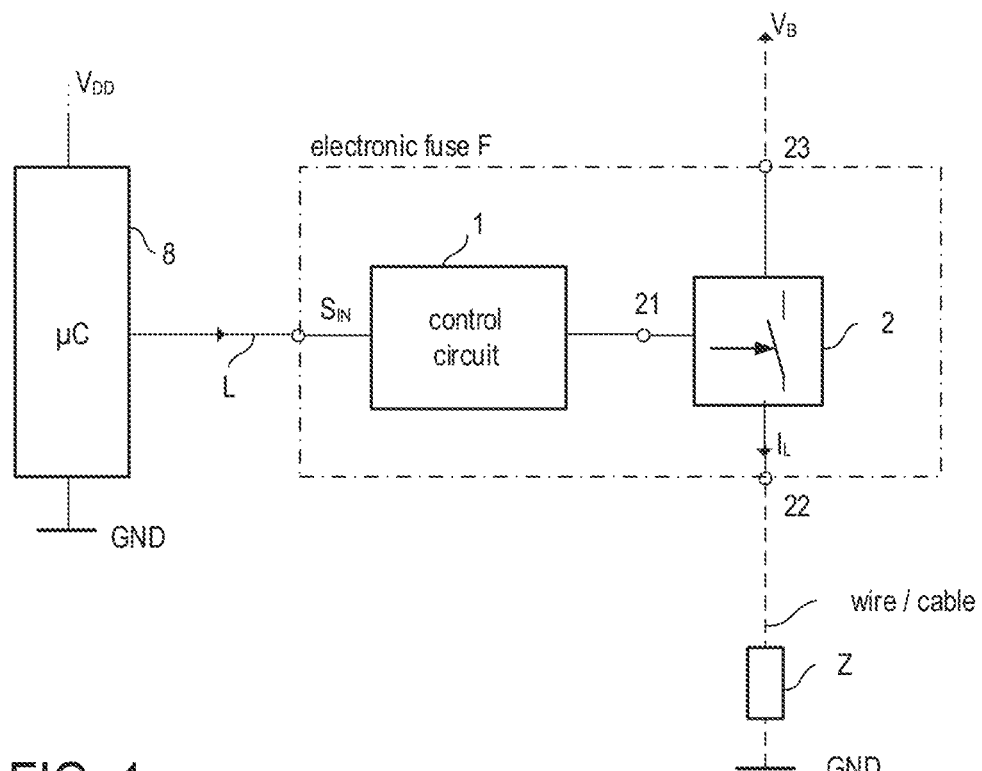
FIG. 1 schematically illustrates one example of an electronic fuse circuit including an electronic switch and a control circuit configured to drive the electronic switch and an exemplary application of the electronic fuse circuit.

FIG. 1 illustrates one example of an electronic circuit, which may be operated as an electronic fuse. Therefore the electronic circuit is further referred to as electronic fuse circuit F. In accordance with the present example, an electronic fuse circuit includes an electronic switch 2 with a control node 21 and a load current path between a first load node 22 and a second load node 23. The electronic circuit further includes a control circuit 1 coupled to the control node 21 of the electronic switch 2 and configured to drive the electronic switch 2. The electronic fuse circuit F with electronic switch 2 and control circuit 1 may be monolithically integrated on one semiconductor die (chip) or may be integrated in two semiconductor dies that are arranged in one integrated circuit package. The electronic fuse circuit F is configured to drive a load Z (the wires connecting the load are illustrated in dashed lines in FIG. 1) that can be connected in series with the load current path of the electronic switch 2. Thereby, the series circuit of the load current path of the electronic switch 2 and load Z may be connected between supply nodes, at which a positive supply potential and a negative supply potential or ground potential GND (zero volts) may be provided. In the following, a voltage between the two supply nodes is referred to as supply voltage $V_B$. The load current $i_L$ passing through the load Z may be switched on and off in accordance with an input signal $S_{IN}$ supplied to the control circuit 1, for example, by a micro controller 8. However, dependent on the application the input signal $S_{IN}$ may be generated by any other circuitry instead of a micro controller.

In one exemplary application, the electronic fuse circuit F may be used to drive a load Z in an automobile. In this case, a power source that supplies the supply voltage $V_B$ is an automobile battery. Generally, "to drive a load" may include switching on or off the load current passing through the load by switching on or off the electronic switch 2. The load may be an arbitrary load used in an automobile. Examples of the load Z include, inter alia, different types of lamps, different types of motors, relays, a heating system, or the like. In the example illustrated in FIG. 1, the electronic switch 2 and the load Z are connected in a high-side configuration. That is, the load Z is connected between the electronic switch 2 and the ground node GND. This, however, is only an example. The electronic switch 2 and the load Z may also be connected in a low-side configuration or in any other configuration as well. For example, in a low-side configuration the electronic switch is connected between the load Z and the ground node GND.

According to the example of FIG. 1, the load Z may be connected to the electronic switch 2 via an electrically conductive wire (e.g. included in a cable). Dependent on where the electronic circuit and the respective load Z are located within the electric installation of an automobile, the wire may have a considerable length of several 10 cm or even more (e.g. up to 10 m). A modern automobile includes a plurality of electric loads, so that a plurality of wires is required to connect the individual loads to their respective electronic switches. In order to save costs and resources, it may be desirable to dimension the individual wires such that, on a long term, they withstand a nominal current of the connected load. If, however, the current rises above the nominal current, the wire may be damaged or even destroyed due to overheating. According to one exemplary embodiment, the control circuit 1 may therefore have a current monitor function in order to monitor the load current $i_L$ passing through the electronic switch 2 (and the load Z). The current monitoring allows to switch off the electronic switch 2 in order to protect the wire (and the load Z) when an overload scenario is detected. An "overload scenario" is a scenario that may result in the wire or the load being damaged or destroyed if the electronic switch 2 would not be switched off (within a specific time) to disconnect the wire (and the load Z) from the power source providing the supply voltage $V_B$ (e.g. the automobile battery). This mechanism is explained in further detail herein below. As the electronic fuse circuit F is configured to switch on and off the load Z and to protect the wire, it is also referred to as switching and protection circuit in the following.

According to the example of FIG. 1, the electronic switch 2 is schematically drawn as a circuit block that includes a switch. In the following, the term "electronic switch" includes any type of electronic switch or electronic circuitry that has a control node 21 and a load current path between the first load node 22 and the second load node 23 and that is configured to be switched on and off dependent on a drive signal received at the control node 21. "Switched on" means that the electronic switch 2 operates in an on-state, in which the electronic switch 2 is capable of conducting a current between the first load node 22 and the second load node 23. "Switched off" means that the electronic switch 2 is operated in an off-state, in which the electronic switch 2 is capable of preventing a current flow between the first load node 22 and the second load node 23. According to one example, the electronic switch 2 includes at least one transistor. The at least one transistor may be, for example, a MOSFET (Metal Oxide Semiconductor Field-Effect Transistor), an IGBT (Insulated Gate Bipolar Transistor), a JFET (Junction Field-Effect Transistor), a BJT (Bipolar Junction Transistor), or a HEMT (High Electron Mobility Transistor).

In the following, examples of the control circuit 1 and its function are explained with reference to drawings. In particular, the function of the control circuit 1 is explained with reference to functional blocks depicted in the drawings. It should be noted that these functional blocks represent the function of the control circuit 1 rather than its specific implementation. These functional blocks may be dedicated circuit blocks configured to perform the respective function explained below. However, may also be possible that the functions of the individual functional blocks are performed by a programmable circuit (processor), which is configured to execute software stored in a memory.

Figure 2:
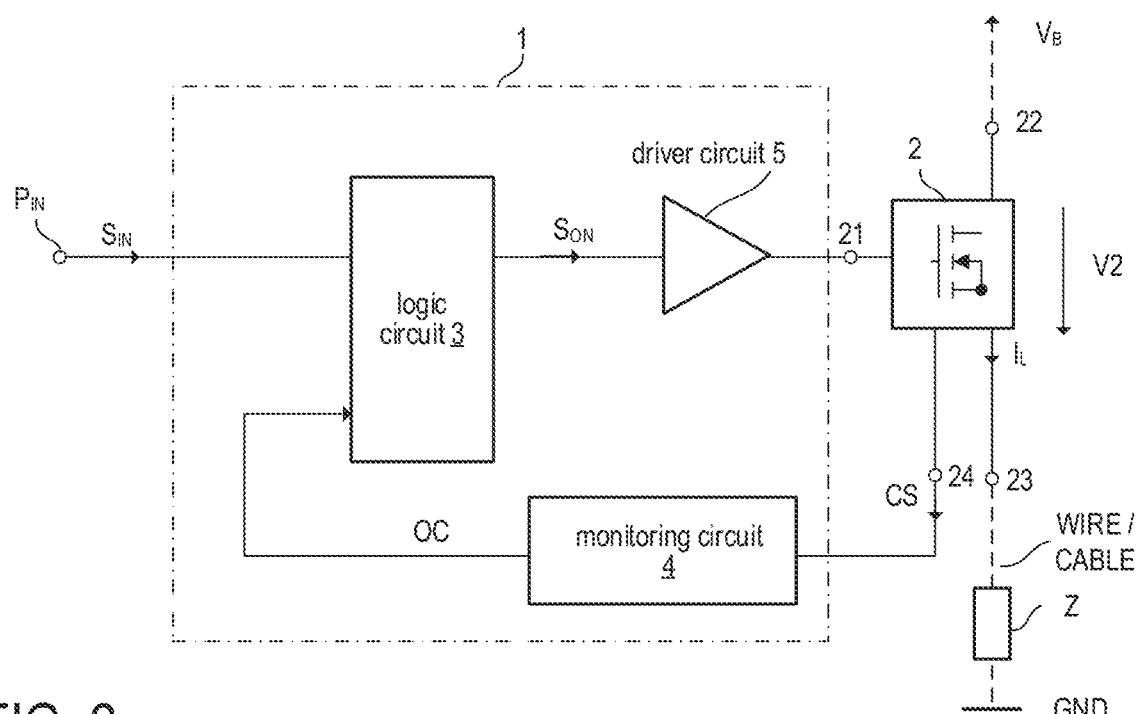
FIG. 2 illustrates one example of the control circuit of FIG. 1 in more detail.

FIG. 2 illustrates one exemplary implementation of the control circuit 1. In this example, the control circuit 1 includes a monitoring circuit 4 that is configured to generate a first protection signal OC based on a current-time-characteristic of the load current $i_L$. The expression "to generate the first protection signal OC based on the current-time-characteristic of the load current $i_L$" may include that the monitoring circuit 4 processes an instantaneous current level of the load current $i_L$ as well as previous current levels to generate the first protection signal OC. That is, the monitoring circuit 4 evaluates the load current $i_L$ over a certain time period in order to generate the first protection signal OC. To be able to evaluate the load current $i_L$ the monitoring circuit 4 receives a current sense signal CS and generates the first protection signal OC based on the current sense signal CS. The current sense signal CS represents the load current $i_L$ and, according to one example, may be proportional to the load current $i_L$. In the example of FIG. 2, the current sense signal CS (which may also be referred to as current sense signal) is available at a sense output 24 of the electronic switch 2. In this case, a current measurement circuit configured to measure the load current $i_L$ and provide the current sense signal CS may be integrated in the electronic switch 2. However, this is only an example. A current measurement circuit separate from the electronic switch 2 may be used as well. Various current sense circuits (e.g. shunt resistors, sense FET circuits, etc.) are known and are thus not further explained herein in more detail.

The control circuit 1 illustrated in FIG. 2 is configured to drive the electronic switch 2 based on the first protection signal OC and an input signal $S_{IN}$ received at a first input node (e.g. input pin) PIN of the electronic fuse circuit F. The first protection signal OC as well as the input signal $S_{IN}$ are supplied to a logic circuit 3, which generates a drive signal $S_{ON}$ based on the first protection signal OC and the input signal $S_{IN}$. The drive signal $S_{ON}$ is directly or indirectly (e.g. via driver circuit 5) supplied to the control node 21 of the electronic switch 2 in order to switch the electronic switch 2 on or off. According to one example, the drive signal $S_{ON}$ may be a logic signal that has an on-level indicating that it is desired to switch the electronic switch 2 on or an off-level indicating that it is desired to switch the electronic switch 2 off. The driver circuit 5 (or simply driver) is configured to drive the electronic switch 2 based on the respective signal level of the drive signal $S_{ON}$. The electronic switch 2, for example, includes a transistor, such as a MOSFET (as schematically illustrated in FIG. 2). A MOSFET is a voltage controlled semiconductor device that switches on or off dependent on a drive voltage applied between a gate node and a source node. In this example, the driver 5 is configured to generate the drive voltage (gate voltage) based on the drive signal $S_{ON}$ in order to switch on or off the MOSFET in accordance with the drive signal. When using MOSFETs, the driver 5 is also referred to as gate driver.

Figure 3:
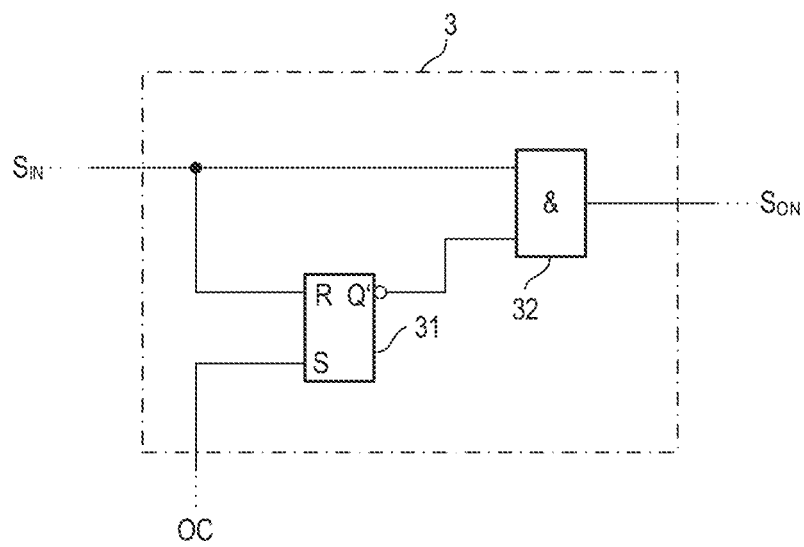
FIG. 3 illustrates one example of a logic circuit used in the control circuit of FIG. 2.

The circuit of FIG. 3 illustrates one exemplary implementation of the logic circuit 3. In the present example, the logic circuit 3 includes a SR latch 31 (flip-flop) and an AND gate 32. A reset input R of the SR latch 31 as well as a first input of the AND gate 32 are configured to receive the input signal $S_{IN}$. The set input S of the SR latch 31 is configured to receive the first protection signal OC. The inverting output Q' of the SR latch 31 is connected with a second input of the AND gate 32. The drive signal $S_{ON}$ is provided at the output of the AND gate 32.

Figure 4:
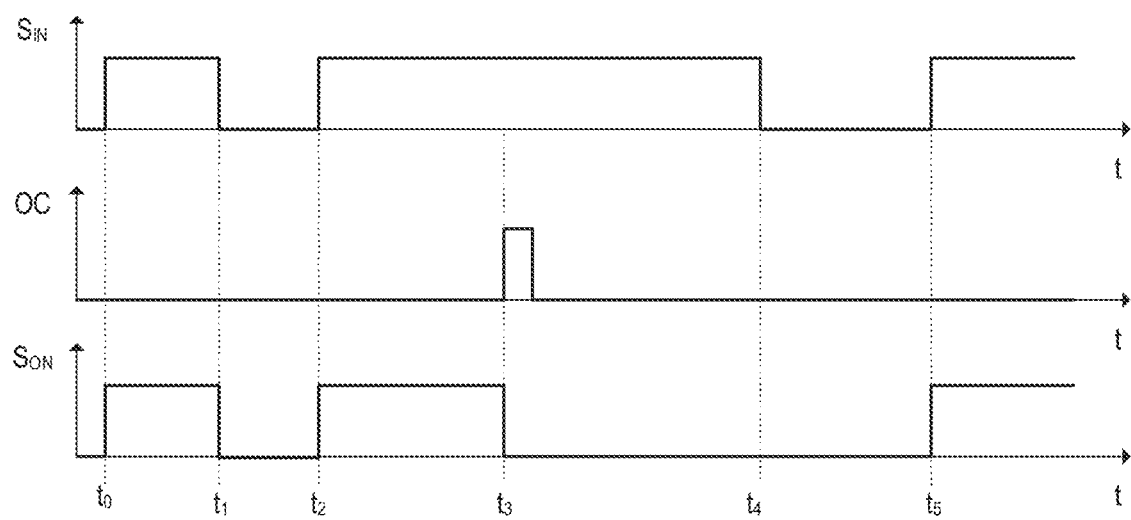
FIG. 4 includes timing diagrams illustrating the function of the control circuit shown in FIG. 2.

The function of the logic circuit 3 is further illustrated by the timing diagrams of FIG. 4. When the input signal $S_{IN}$ changes to a high level (indicating a switch-on of the electronic switch 2, see FIG. 4, time instant $t_0$ and $t_1$), the SR latch 31 is reset, which results in a high level at the inverting output Q' of the SR latch 31. Accordingly, both inputs of the AND gate 32 "see" a high level, and thus the output of the AND gate 32 provides the drive signal $S_{ON}$ with a high-level. When the input signal $S_{IN}$ changes to a low level (indicating a switch-off of the electronic switch 2, see FIG. 4, time instant $t_1$ and $t_2$), the AND gate 32 "sees" a low level at its first input, and thus the output of the AND gate 32 provides the drive signal $S_{ON}$ with a low-level. In other words, the input signal $S_{IN}$ is fed through the logic circuit 3 (i.e. the drive signal $S_{ON}$ equals the input signal $S_{IN}$) provided that the SR latch 31 is in its reset state. Once the SR latch 31 is set by the first protection signal OC changing to a high-level, the inverting output Q' of the SR latch 31 is set to a low level (see FIG. 4, time instant $t_3$). Accordingly, the AND gate 32 sees a low level at its second input and thus the drive signal $S_{ON}$ is set to a low level. In other words, the input signal $S_{IN}$ is blanked by the AND gate 32. The drive signal $S_{ON}$ remains at a low-level until the input signal $S_{IN}$ is set to a low level (indicating a switch-off of the electronic switch 2, see FIG. 4, time instant $t_4$) and again to a high level (indicating a switch-on of the electronic switch 2, see FIG. 4, time instant $t_5$), which leads to a reset of the SR latch 31. It is again noted that the function of the exemplary implementation of FIG. 3 may be implemented in various ways.

Figure 5A:
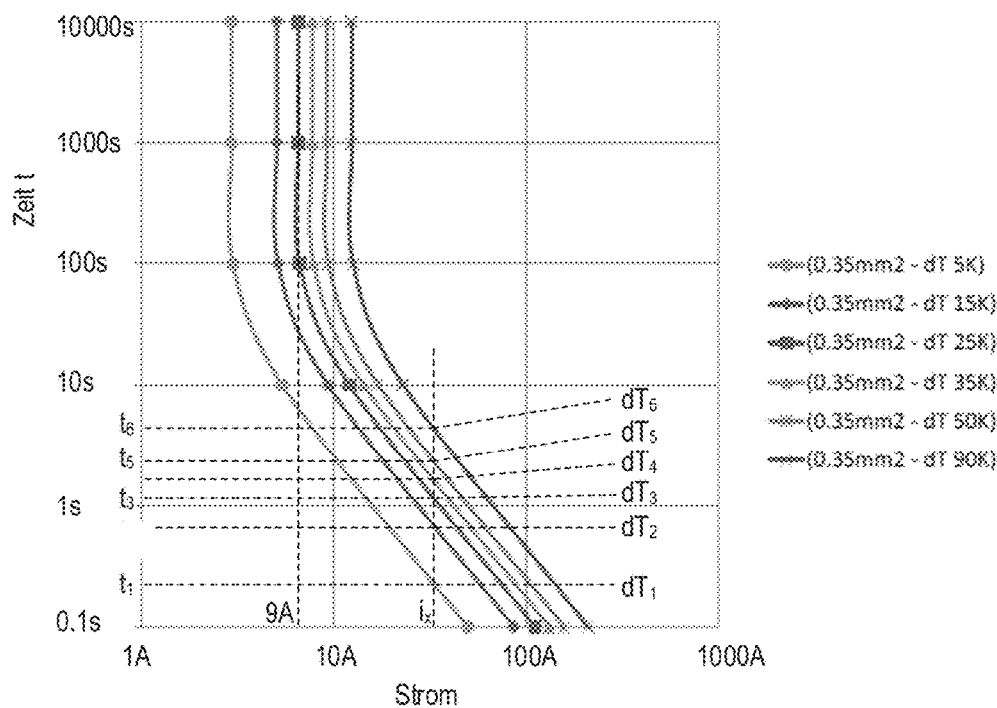
FIG. 5A is a diagram illustrating a family of characteristic curves (time over current) for a 0.35 mm$^2$ cable and for different maximum cable temperatures.
Figure 5B:
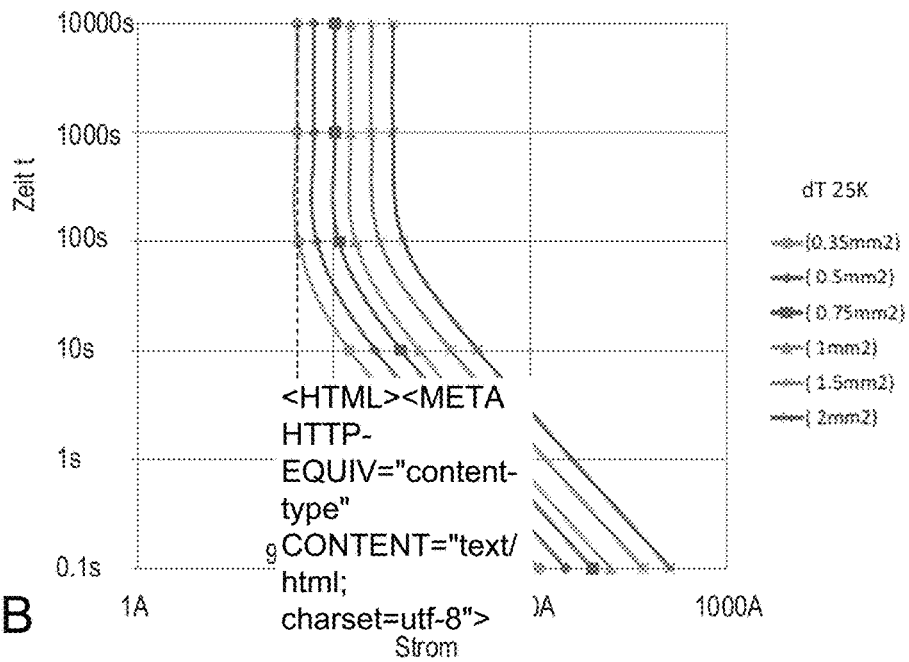
FIG. 5B is a diagram illustrating a family of characteristic curves (time over current) for a maximum cable temperature of 25 Kelvin above ambient temperature and for different cable cross-sections.

As mentioned above the wire connecting load Z and electronic fuse circuit F may be designed to withstand a nominal current of the load Z. The lifetime of a wire (or a cable) depends on the wire temperature. FIGS. 5A and 5B are diagrams including a family of characteristic curves, wherein each characteristic curve is associated with a specific combination of maximum temperate difference dT (maximum temperature above ambient temperature) and cable cross section (cross-sectional area in $mm^2$). Each characteristic curve represents the relation between current and the maximum allowable time period, which the wire can carry the current without exceeding the maximum temperature difference. FIG. 5A includes characteristic curves for various temperature differences dT and a fixed cross sectional area of 0.35 mm², while FIG. 5B characteristic curves for a fixed temperature differences dT of 25 K (Kelvin) and various cross sectional areas of 0.35 mm². As can be seen from FIGS. 5A and 5B, a wire with a cross-sectional area of 0.35 mm² may carry a current of approximately 9 A (amperes) for practically infinite time without exceeding a temperature difference dT of 25 K above ambient temperature. As can be seen from FIG. 5B, a wire with a cross-sectional area of 0.75 mm² may carry a current of 10 A (amperes) for approximately 100 seconds before exceeding a temperature difference dT of 25 K above ambient temperature. Generally, the higher the current, the shorter the allowable time period for a given cross-sectional area and a given temperature difference. It is noted that the characteristic curves shown in the diagrams of FIGS. 5A and 5B have a linearly falling branch in a double logarithmic representation.

As can be seen from FIGS. 5A and 5B, a temperature difference $dT_x$ (e.g. temperature values $dT_1$, $dT_2$, $dT_3$, $dT_4$, $dT_5$, $dT_6$) is associated with a given integration time $t_x$ (e.g. times $t_1$, $t_2$, $t_3$, $t_4$, $t_5$, $t_6$) for a given current (see FIG. 5A, current $i_x$) and a specific cross-sectional area (e.g. 0.35 mm² in the example of FIG. 5A). Hence, a temperature value dT may be determined for a specific wire cross section by integrating the current $i_x$ passing through the wire over time, and the first protection signal OC may indicate a switch-off of the electronic switch 2 when the temperature value dT reaches a defined first reference temperature difference $dT_x$. The mentioned integration may be efficiently implemented using a digital filters, which may be included in the monitoring circuit 4 (see FIG. 2). One exemplary implementation of a monitoring circuit is illustrated in FIG. 6.

Figure 6:
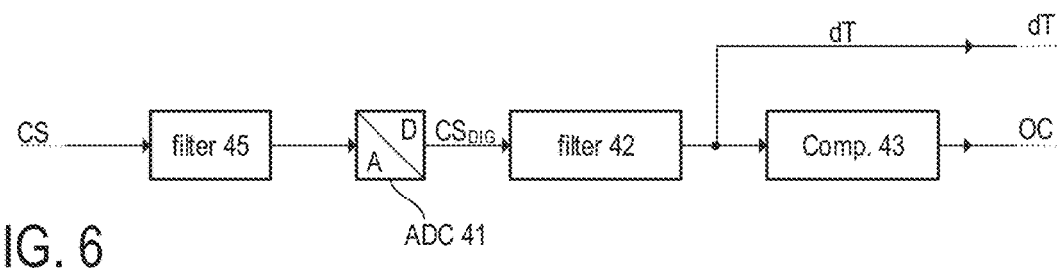
FIG. 6 illustrates one example of the monitoring circuit used in the example of FIG. 2.

Basically, the monitoring circuit of FIG. 6 is configured to determine the first protection signal OC based on the current sense signal CS. As mentioned, the integration may be accomplished in digital filter 42 which has an integrating characteristic. According to the depicted example, the current sense signal CS, which may be a voltage that is proportional to the load current $i_L$ is supplied to the input of filter 45, which may be an (optional) analog low-pass filter. The output of filter 45 may be connected to the input of analog-to-digital converter (ADC) 41, which is configured to digitize the filtered current sense signal CS. The ADC 41 may have a logarithmic characteristic in order to account for the logarithmic characteristic curves shown in FIGS. 5A and 5B. The (logarithmized) digital current sense signal $CS_{DIG}$ is then converted to a temperature value dT by digital filter 42. The resulting temperature value dT (representing a temperature difference above ambient temperature) is then supplied to digital comparator 43, which may be configured to set the first protection signal OC to a high-level when the temperature value dT provided at the output of digital filter 42 exceeds the first reference temperature difference $dT_x$ (e.g. 25 K) specified for a specific wire cross-section.

As mentioned, the digital filter 42 is configured to convert the load current (represent by the digitized current sense signal $CS_{DIG}$) and an associated integration time, during which the current passes through the wire, into a temperature value. In the present example, the filter characteristic 42 depends on the cross-sectional area of the wire, which carries the current, and may be represented by the family of characteristic curves shown in the diagram of FIG. 5A (for an exemplary cross-sectional area of 0.35 mm²). In one specific example, the characteristic curves may be stored as a look-up table, i.e. by storing a plurality of sampling points of the characteristic curves in a memory. Values between two sampling points may be determined using, e.g. interpolation.

Conventional fuses are produced for a specific trigger current and with a specific trigger time (slow blow fuses, medium blow fuses, fast blow fuses), wherein the trigger time corresponds to a specific combination of reference temperature $dT_x$ and cross-section as explained above (see FIGS. 5A and 5B). It would be desirable, however, to have a configurable fuse, which may be used for various wire parameters such as, for example, wire cross-sections and maximum temperature values $dT_x$ (maximum temperature above ambient temperature).

Figure 7:
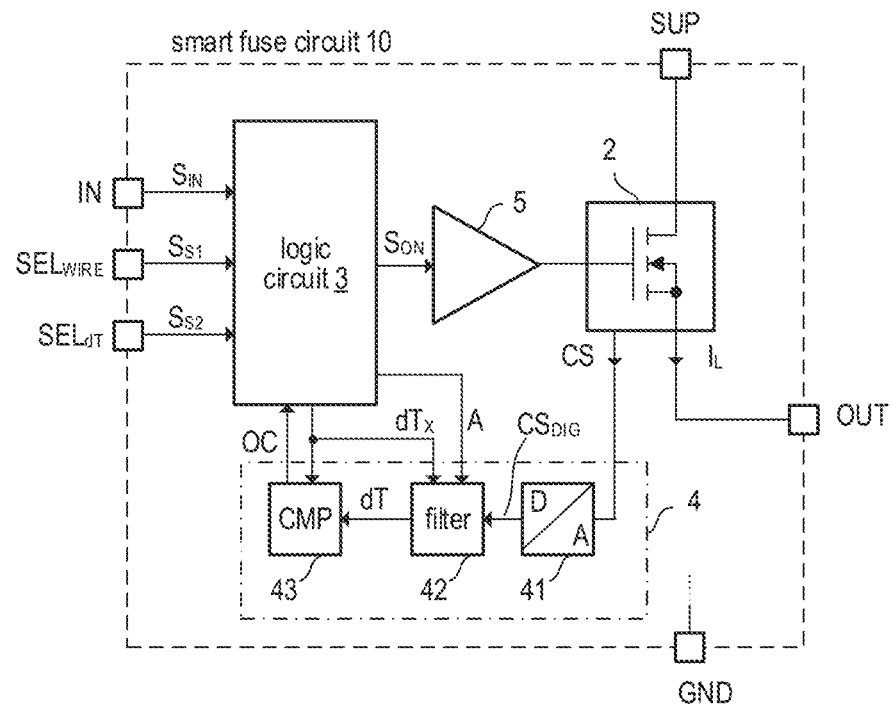
FIG. 7 illustrates a first example of an e-fuse ("smart fuse") circuit, which allows selection of wire cross section and maximum cable temperature.

FIG. 7 illustrates one example of an electronic fuse circuit, which is further referred to as smart fuse circuit 10. The circuit of FIG. 7 is substantially the same as the circuit of FIG. 2 and reference is made to the respective description. However, the logic circuit 3 is more sophisticated as in the example of FIG. 2 and the monitoring circuit 4 is implemented in accordance with FIG. 6, wherein the analog low-pass filter 45 has been omitted (the low-pass filter 45 is optional). However, different from the example in FIG. 6, the monitoring circuit 4 is configurable in the present example so that its characteristic can be adapted based on at least one wire parameter, which allows, for example, selecting a characteristic for a specific wire cross section and a desired reference temperature difference $dT_x$. In the examples described herein, the at least one wire parameter is or represents the cable cross-sectional area or the maximum temperature value above ambient temperate or both. As can be seen in the diagrams of FIG. 5, these two wire parameters define a specific characteristic curve, which represents the desired behavior of the electronic fuse circuit for a specific wire/cable. It is understood that other parameters such as wire diameter or absolute temperature (e.g. in case ambient temperature is measured) may be used as wire parameters. Furthermore, a wire parameter is not necessarily proportional to any physical quantity (such as cross-sectional area or temperature) but can be a mere numerical parameter, which allows determining (e.g. selecting) the desired characteristic used by the monitoring circuit. As shown in FIG. 7, the smart fuse circuit may be an integrated circuit arranged in one chip package, wherein the electronic switch 2 and the remaining circuit components (driver 5, logic circuit 3 and monitoring circuit 4) may be integrated in the same semiconductor die or in two separate semiconductor dies disposed in the chip package. However, in other embodiments the smart fuse circuit 10 may be distributed in two or more separate chip packages.

The load current path of the electronic switch 2 may be connected between a supply pin SUP and an output pin OUT of the smart fuse circuit 10. Generally, the logic circuit 3 may be configured to receive at least one wire parameter, which, in the present example, includes information about a wire cross-sectional area A and a reference temperature difference $dT_x$, from a microcontroller or other control circuitry. As illustrated in FIG. 6, the logic circuit 3 may be configured to receive signals from a controller via input pin IN (input signal $S_{IN}$, see also FIG. 2) and input pins $SEL_{WIRE}$ and $SEL_{dT}$ (selection signals $S_{S1}$ and $S_{S2}$ representing a wire cross-sectional area and a temperature difference) and to provide a drive signal $S_{ON}$ for the electronic switch 2. The driver 5 may be configured to convert the signal $S_{ON}$, which is a binary logic signal, into a drive voltage or drive current suitable to switch the electronic switch 2 on and off. As in the example of FIG. 2 the monitoring circuit 4 receives an (analog) current sense signal CS and generated, based on this current sense signal CS, the first protection signal OC, which may be processed by the logic circuit 3, for example, as shown in the example of FIG. 3.

Based on the information included in the at least one wire parameter and received, e.g., from the controller, the control logic 3 may configure the digital filter 42 and/or the comparator 43 so that the characteristic of the monitoring circuit 4 corresponds to a specific combination of wire cross-sectional area A and reference temperature difference $dT_x$. In the present example, the monitoring circuit 4 can be configured based on the selection signals $S_{S1}$ and $S_{S2}$ received at the input pins s $SEL_{WIRE}$ and $SEL_{dT}$. Thereby, the selection signal $S_{S1}$ may represent, as a first wire parameter, a reference temperature difference $dT_x$ (which is used as a temperature threshold in the comparator 43) and the selection signal $S_{S2}$ may represent, as a second wire parameter, a cross-sectional area A of the wire. The ground pin GND shown in FIG. 4 is coupled to a reference potential, e.g. ground potential, and connected to the logic circuit 3, and other circuit components, which need a reference potential for proper operation. It is understood that, in another embodiment, the first and the second wire parameter may also be coded into a single (e.g. digital) selection signal.

Figure 8:
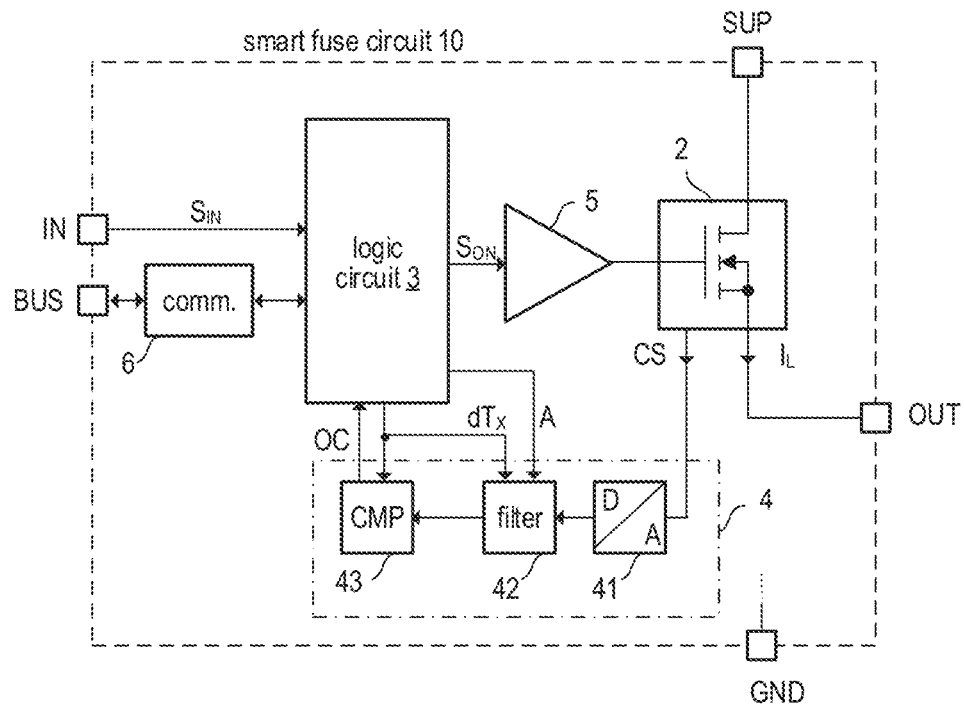
FIG. 8 illustrates a second example of an e-fuse ("smart fuse") circuit, which allows selection of wire cross section and maximum cable temperature.

The selection signals $S_{S1}$ and $S_{S1}$ may be analog signals (e.g. a voltage or a current) and the control logic 3 may be configured to digitize the selection signals $S_{S1}$ and $S_{S1}$. For example, the actual level of the selection signals $S_{S1}$ and $S_{S2}$ may be set by connecting a resistor between the input pin $SEL_{WIRE}$ and a reference potential and a further resistor between the input pin $SEL_{dT}$ and a reference potential. The resistance values of the resistors (and the reference potential) determine the level of the selection signals $S_{S1}$ and $S_{S1}$ (see also FIGS. 11 and 12). The example of FIG. 8 illustrates a modification of the previous example of FIG. 7, in which the information about the wire cross-sectional area and the first reference temperature $dT_x$ is communicated to the logic circuit 3 via a digital communication interface 6. The communication interface 6 may be, for example, a serial bus interface such as an Serial Peripheral Interface (SPI) or an Inter-Integrated-Circuit (I²C) bus interface or similar. However, parallel bus communication may also be used instead of a serial bus. The bus pin labelled PIN is representative of one or more pins used to connect a controller via bus lines. Based on the information, which the logic circuit 3 receives via the communication interface 6, the characteristic of the digital filter 42 and the comparator 43 may be configured so that the overall characteristic of the monitoring circuit corresponds to a desired wire cross-section and reference temperature difference $dT_x$. As mentioned, the filter characteristic of the digital filter 42 may depend on the wire cross-sectional area A and the characteristic of the comparator 43 (comparator threshold) may depend on the desired reference temperature difference $dT_x$.

Figure 9:
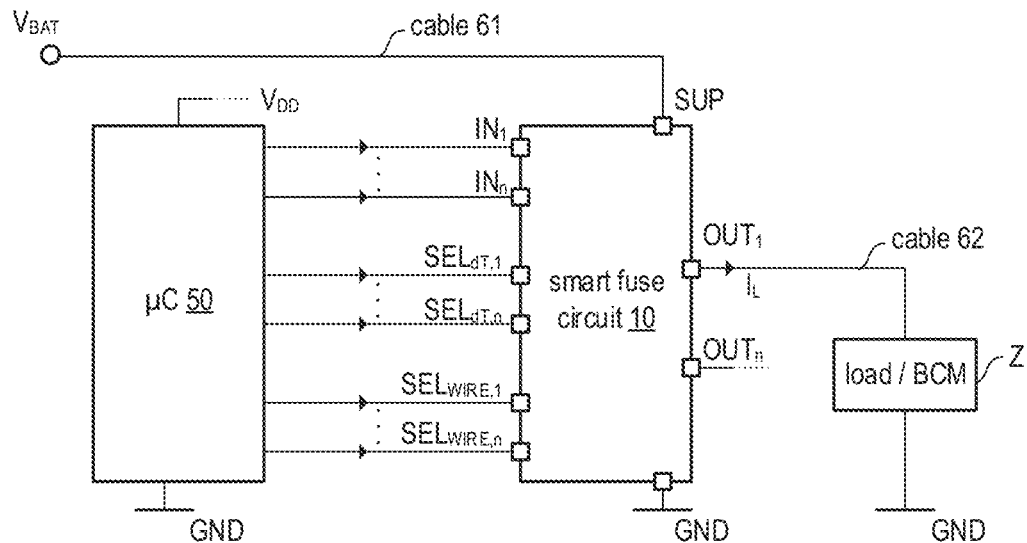
FIG. 9 illustrates a first example of a multi-channel e-fuse ("smart fuse") circuit, which allows selection of wire cross section and maximum cable temperature.

In the examples of FIGS. 7 and 8 only a single load is connected to the smart fuse circuit 10. However, a smart fuse circuit may have two or more output channels to drive two or more loads, wherein a load may be, for example, a simple electric component like a lamp or a more complex electronic module like a body control module (BCM) or any other electronic control module (ECU) in automotive applications. Other (non-automotive) applications have also been conceived. The example of FIG. 9 illustrates a multi-channel smart fuse circuit 10 having a plurality of output channels. Accordingly, the smart fuse circuit 10 has a supply pin SUP and a plurality of output pins $OUT_1, OUT_2, \ldots, OUT_n$. The supply pin SUP is connected to a wire (cable) 61 which connects the supply pin SUP with a supply terminal (e.g. battery terminal) providing a supply voltage denoted $V_{BAT}$. A load may be connected between each of the output pins $OUT_1, OUT_2, \ldots, OUT_n$ and a reference potential (e.g. ground). To keep the figure clear and simple only one load Z is shown in FIG. 9, and the load Z is connected to the respective output pin $OUT_1$ via wire (cable) 62. In the smart fuse circuit 10, each output channel includes one electronic switch that provides (when switched on) a current path between the supply pin SUP and the respective output pin $OUT_1, OUT_2, \ldots, OUT_n$. Thus, the smart fuse circuit 10 is configured to connect and disconnect wire 62 and wire 6$i$. Furthermore, a monitoring circuit 4 coupled to each electronic switch to generate a protection signal OC for each output channel. The logic circuit 3 is configured to process all the protection signals OC and provide a drive signal $S_{ON}$ for each output channel. Input signal $S_{IN,1}, \ldots S_{IN,n}$ are supplied to the logic circuit 3 via input pins $IN_1, \ldots, IN_n$, wherein each input signal is associated with one of the output channels. Similarly, selection signals are supplied to the logic circuit 3 via input pins $SEL_{WIRE,1}, \ldots, SEL_{WIRE,n}$, and $SEL_{dT,1}, \ldots, SEL_{dT,n}$. These selection signals carry information concerning the wire parameters used for the different output channels. The monitoring circuit of each output channel may be configured based on the level of the selection signals as explained above with reference to FIG. 7 or 8. In the present example, microcontroller 50 is configured to generate the input signals $S_{IN,1}, \ldots S_{IN,n}$, and the corresponding selection signals.

Figure 10:
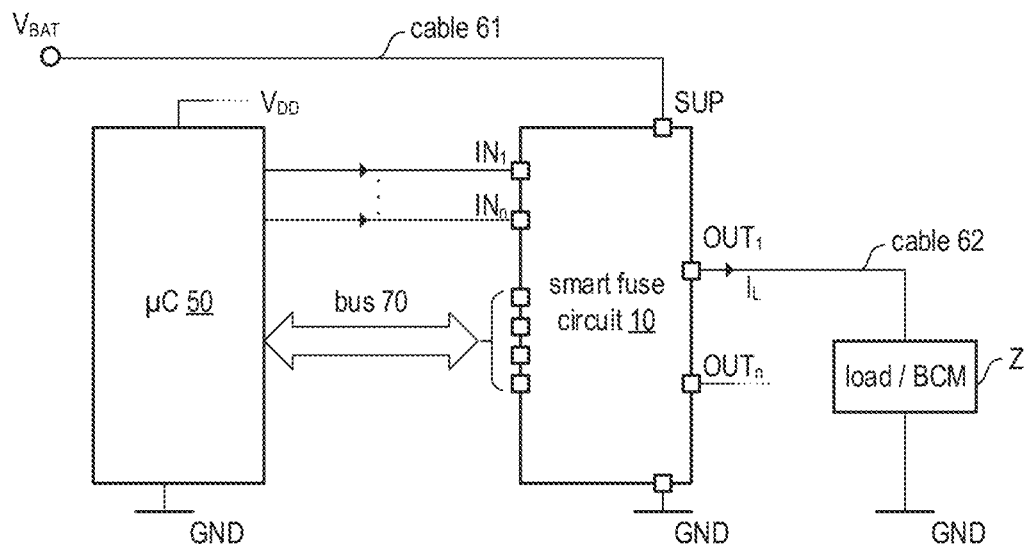
FIG. 10 illustrates a second example of a multi-channel e-fuse ("smart fuse") circuit, which allows selection of wire cross section and maximum cable temperature.

FIG. 10 illustrates another example of a multi-channel smart fuse circuit 10, which is basically a multi-channel enhancement of the basic example of FIG. 8. For each channel, the wire parameters (e.g., information concerning the wire cross-sectional area and the reference temperature difference $dT_x$) are communicated via a digital bus 70 (e.g. SPI bus I²C bus, etc.) to the smart fuse circuit 10 by the microcontroller 50. Apart from the digital communication interface, the example of FIG. 10 is the same or very similar to the example of FIG. 9 and reference is made to the respective description above.

Figure 11:
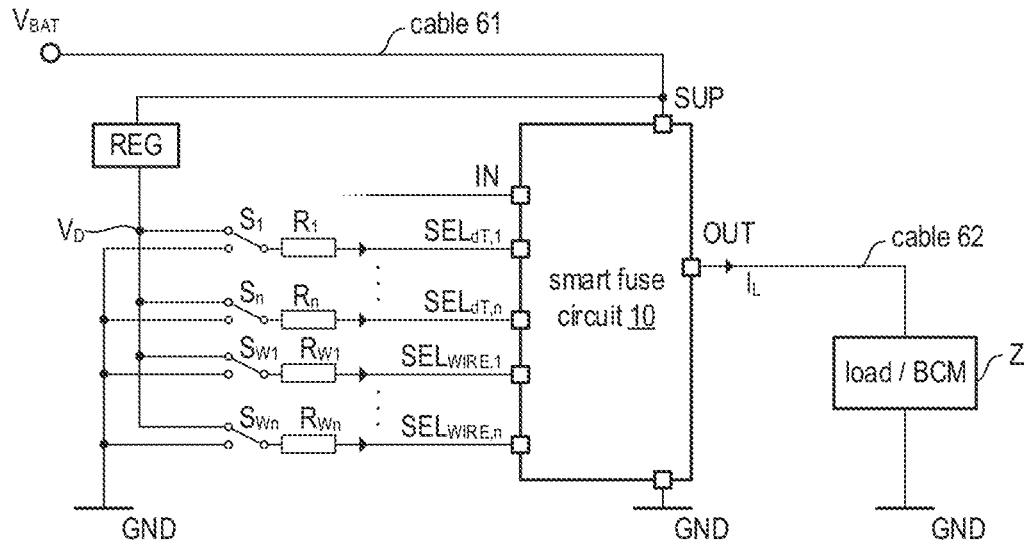
FIG. 11 illustrates a one example of an e-fuse ("smart fuse") circuit, which allows selection of wire cross section and maximum cable temperature using resistors.

FIG. 11 illustrates one example of a (single-channel) smart fuse circuit, which allows to set the wire cross-sectional area A and the desired reference temperature difference $dT_x$ via external resistors (resistors externally connectable to the smart fuse circuit 10). This allows a very simple configuration of the smart fuse circuit by passive electronic components without the need for a complex microcontroller. In the present example the pins $SEL_{dT,1}, \ldots, SEL_{dT,n}$ are not associated with different output channels but with different bit positions of a digital selection signal (e.g. similar to the selection signal $S_{S2}$ shown in FIG. 9). In case n=4, four pins $SEL_{dT,1}, SEL_{dT,2}, SEL_{dT,3}, SEL_{dT,4}$ allow to receive a 4-bit selection signal $S_{S2}$ and to discriminate $2^4=16$ different reference temperature differences $dT_x$ (maximum temperature above ambient temperature). Analogously, the pins $SEL_{WIRE,1}, \ldots, SEL_{WIRE,n}$ are associated with different bit positions of a digital selection signal $S_{S1}$. In case n=3, four pins $SEL_{WIRE,1}, SEL_{WIRE,2}, SEL_{WIRE,3}$ allow to receive a 3-bit selection signal $S_{S1}$ and to discriminate $2^3=8$ different cross-sectional area values of the connected wire. In order to set the individual bits of the signals $S_{S1}$ and $S_{S2}$ each of the pins $SEL_{dT,1}, \ldots, SEL_{dT,n}$, and $SEL_{WIRE,1}, \ldots, SEL_{WIRE,n}$ may be coupled either with a circuit node providing a defined voltage $V_D$ or with reference potential (e.g. ground GND). In the present example, the pins may be connected either to the circuit node providing voltage $V_D$ or to ground GND via switches $S_1, \ldots, S_n$ and, respectively, switches $SW_1, \ldots, SW_n$. Resistors $R_1, \ldots, R_n$, and, respectively, $RW_1, \ldots, RW_n$, may be connected between the input pins $SEL_{dT,1}, \ldots, SEL_{dT,n}$, and $SEL_{WIRE,1}, \ldots, SEL_{WIRE,n}$ and the switches $S_1, \ldots, S_n$ and, respectively, $SW_1, \ldots, SW_n$ in order to limit the current during switching or may be part of a ESD (electrostatic discharge) protection structure. Dependent on the application, the resistors may also be omitted or included in the smart fuse circuit 10. The voltage $V_D$ may be provided, for example, by a voltage regulator REG based on the battery voltage $V_{BAT}$. The logic circuit 3 included in the smart fuse circuit 3 may process the digital selection signals $S_{S1}$ and $S_{S2}$ similarly as the example of FIG. 8, in which information concerning wire cross-sectional area A and reference temperature difference $dT_x$ is communicated via a bus.

Figure 12:
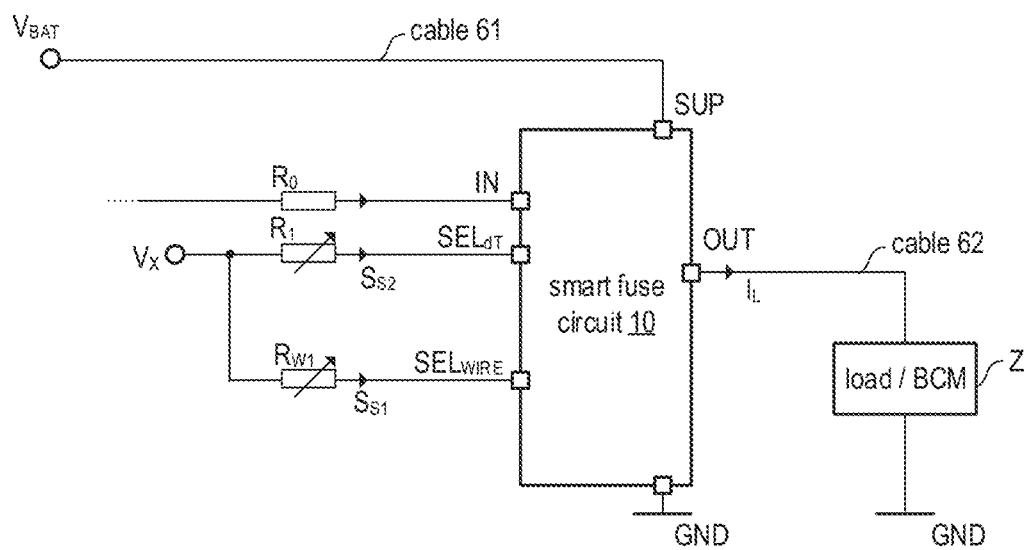
FIG. 12 illustrates another example of an e-fuse ("smart fuse") circuit, which allows selection of wire cross section and maximum cable temperature using variable resistor.

FIG. 12 illustrates a modification of the example of FIG. 11, in which wire parameters (e.g., the information about wire cross-sectional area A and reference temperature difference $dT_x$) are set via adjustable resistors $R_1$ and $RW_1$ (e.g. potentiometers) coupled between a circuit node providing a (e.g. constant) voltage $V_X$ and input pin $SEL_{dT}$ and, respectively, input pin $SEL_{WIRE}$. The voltage $V_X$ may be a regulated reference voltage (such a voltage $V_D$ in the example of FIG. 11) or may also be zero (e.g. the circuit node providing voltage $V_X$ may be a ground node). The resistance value of resistors $R_1$ and $RW_1$ determines the current, which passes through the resistors $R_1$ and $RW_1$ and which has to be sourced or drained by the smart fuse circuit 10 via input pins $SEL_{WIRE}$ and $SEL_{dT}$. The currents passing through the resistors $RW_1$ and $R_1$ may be regarded as selection signals $S_{S1}$ and $S_{S2}$, respectively, and the smart fuse circuit 10 may be configured to evaluate the current level of these selection signals $S_{S1}$ and $S_{S2}$ and configure the monitoring circuit 4 accordingly as already discussed further above with reference to FIGS. 7 to 11. For example, the logic circuit 3 (see FIG. 7) may include analog-to-digital converters to convert the analog selection signals $S_{S1}$ and $S_{S2}$ into digital signals, and the logic circuit 3 may process the resulting digital selection signals in a similar way as in the previous example of FIG. 11.

In the examples described above with reference to FIGS. 7 to 12, the wire cross-sectional area A as well as the reference temperature difference $dT_x$ can be set either by a microcontroller (or similar circuitry) or by passive circuit components like resistors. In any example, the monitoring circuit 4 included in the smart fuse circuit 10 is configured to generate a first protection signal OC based on a current sense signal CS, which represents the current passing through the electronic switch. Particularly, the monitoring circuit 4 estimates a wire temperature dT (temperature above ambient temperature) based on the current sense signal CS and compares the estimated wire temperature dT with the first reference temperature difference $dT_x$. If the estimated wire temperature dT reaches or exceeds the first reference temperature difference $dT_x$ then the first protection signal OC is set to a logic level indicating a switch-off of the electronic switch. However, with regard to functional safety of a (e.g. automotive) system or subsystem a mere switch-off of one system component (i.e. a load) may be problematic. If one system component suddenly fails and is switched, the whole system may fail; protecting one system component may thus result in a failure of the whole system. Dependent on the application such a scenario may be hazardous and it may necessary to avoid such scenarios.

The following examples of FIGS. 13 to 16 provide a feature that allows to "pre-warn" a controller or other control circuitry about an imminent switch-off of the electronic switch 2 included in the smart fuse circuit 10 (and thus about an imminent disconnection of supply node SUP and load). In other words, the smart fuse is able to generate a pre-warning signal before the fuse is actually "blown" (i.e. a switch-off of the electronic switch is triggered). The selection of wire cross-section and reference temperature has been omitted in the following examples. It is understood, however, that the any of the examples of FIGS. 13 to 16 may be combined with any of the examples of FIGS. 7 to 12; however, they need not be combined with the examples of FIGS. 7 to 12.

Figure 13:
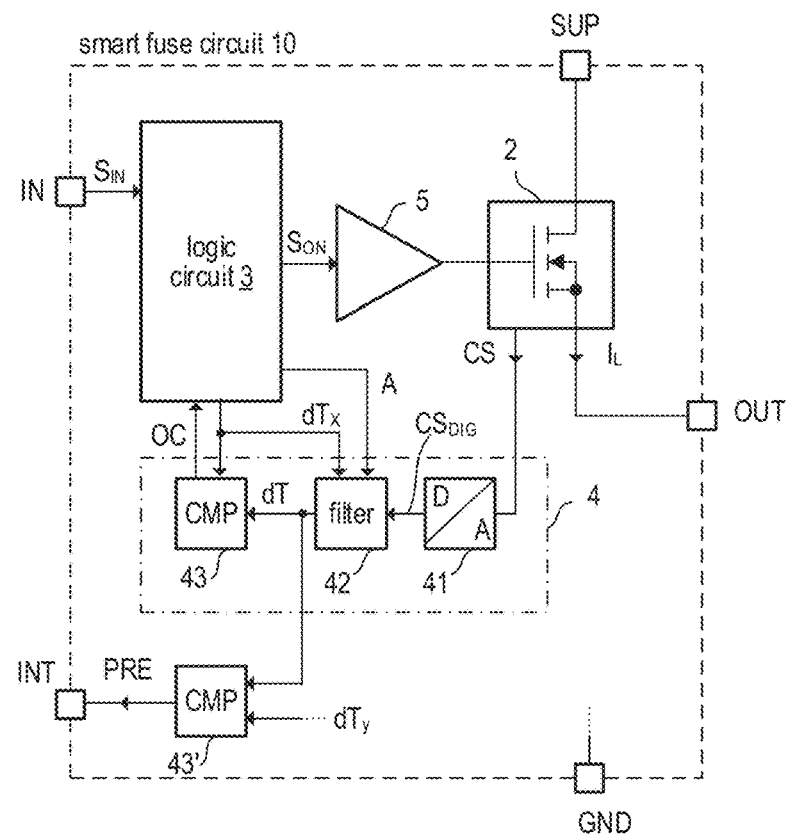
FIG. 13 illustrates a first example of another e-fuse ("smart fuse") circuit configured to provide a pre-warning signal.

FIG. 13 illustrates a smart fuse circuit 10 which is very similar to the circuit of FIG. 2. Accordingly, the smart fuse circuit 10 include a logic circuit 3 which is configured to receive, e.g. via input pin IN, an input signal $S_{IN}$. The logic circuit 3 is configured to either feed through the input signal $S_{IN}$ and provide it as drive signal $S_{ON}$ or to blank the input signal $S_{IN}$ dependent on the level of the first protection signal OC. The signals $S_{IN}$ and $S_{ON}$ are binary logic signals. The drive signal $S_{ON}$ is either directly supplied to a control electrode of an electronic switch 2 or via a driver circuit 5 which is configured to generate, based on the drive signal $S_{ON}$, voltage or current signals suitable to switch the electronic switch on and off. The smart fuse circuit includes a current sense circuit (not shown) which may be included in or coupled to the electronic switch 2. The current sense circuit provides a current sense signal CS representing the load current $i_L$ passing through the electronic switch (and thus through the load and the wire between smart fuse circuit 10 and load. In the present example, the monitoring circuit 4 is basically the same as in the examples of FIGS. 7 and 8 and reference is made to the respective description. As mentioned, the current sense signal CS is digitized by ADC 41, which may have a logarithmic transfer characteristic. The digitized current sense signal $CS_{DIG}$ is filtered by digital filter 42, whose filter characteristic may depend on a parameter representing the wire cross-sectional area. The output signal of digital filter 42 maybe regarded as an estimated temperature difference dT (with respect to room temperature). This estimated temperature difference dT is compared with a first reference temperature difference $dT_x$ by comparator 43 and the comparator output signal is used as first protection signal OC, which indicates a switch-off of the electronic switch when the estimated temperature difference dT reaches or exceeds the first reference temperature difference $dT_x$.

To generate the above-mentioned pre-warning, a second protection signal PRE is generated by a further comparator 43'. Accordingly, the further comparator 43' receives the estimated temperature difference dT provided by digital filter 42 and sets the second protection signal PRE to a logic level that indicated the pre-warning when the estimated temperature difference dT reaches or exceeds a second reference temperature difference $dT_y$. The second reference temperature difference $dT_y$ may be lower than the first reference temperature difference $dT_x$. The difference $dT_x - dT_y$ may either be constant or selected in a similar manner than the $dT_x$ value. The second protection signal PRE may be provided at an output pin INT of the smart fuse circuit 10. In one embodiment the output pin INT may be connected to an interrupt pin of a microcontroller, which is thus able to react on a hardware interrupt triggered by the second protection signal PRE. With regard to the other input, supply and output pins IN, OUT, SUP, GND, reference is made to the examples of FIGS. 7 and 8.

Figure 14:
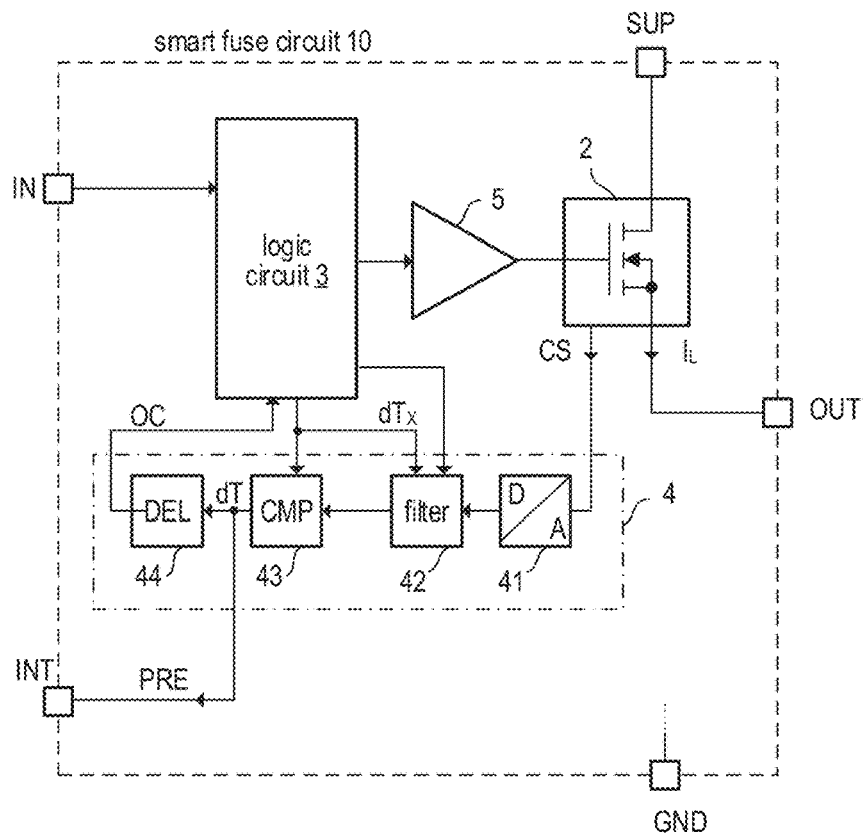
FIG. 14 illustrates a second example of another e-fuse ("smart fuse") circuit configured to provide a pre-warning signal.

The example of FIG. 14 is a modification of the previous example of FIG. 13. In contrast to the previous example, the first protection signal OC is merely a delayed version of the second protection signal PRE, and only one reference temperature difference $dT_x$ is used to generate the signals PRE and OC. Apart from the monitoring circuit 4, FIG. 13 and FIG. 14 are substantially the same. However. As compared to the previous example of FIG. 13, the monitoring circuit 4 includes an additional delay element 44, which is coupled to the output of comparator 43 so that the delay element provides a delayed version of the comparator output signal. In the present example, the delayed output signal of comparator 43 is used as first protection signal OC and the undelayed output signal of comparator 43 is used as second protection signal PRE. When the estimated temperature difference dT provided by filter 42 reaches the first reference temperature difference $dT_x$ the second protection signal PRE signals a pre-warning at output pin INT (which may trigger, e.g. an interrupt in a controller connected to the pin INT). A defined delay time later, a switch-off of the electronic switch 2 may be initiated. The delay time may be fixed or configurable in a similar manner as other parameters like the wire cross section.

Figure 15:
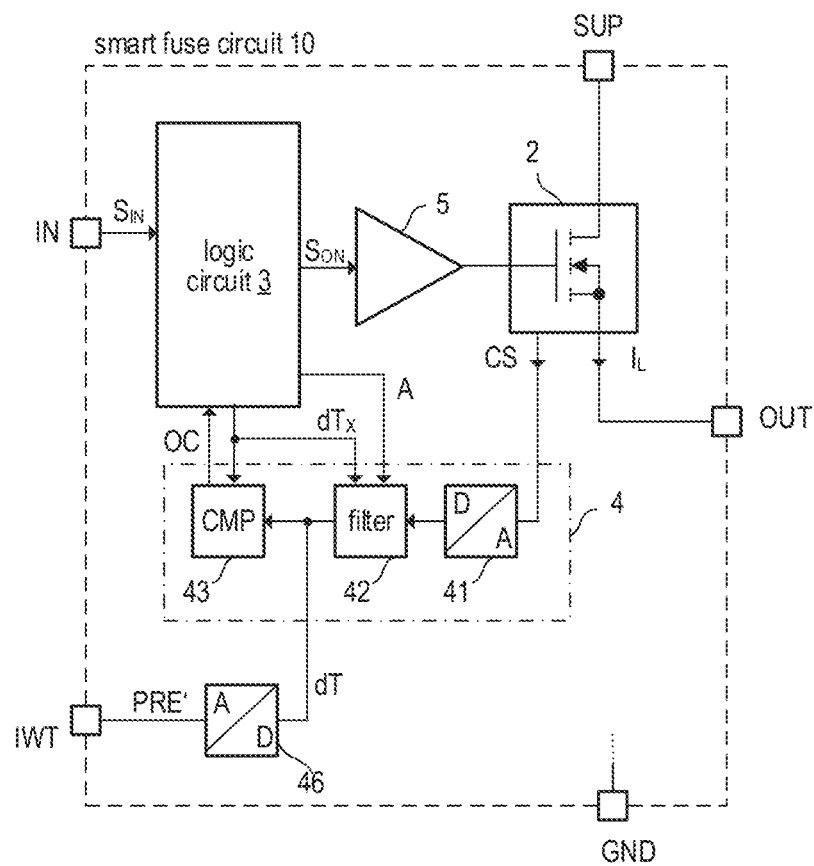
FIG. 15 illustrates a third example of another e-fuse ("smart fuse") circuit configured to provide a pre-warning signal.

In the example of FIG. 15 a signal representing the estimated wire temperature difference dT, which is provided by filter 42 included in the monitoring circuit 4 is used as second protection signal (pre-warning signal). The example of FIG. 15 is the same as the previous example of FIG. 13 except that the further comparator 43' has been replaced by a digital-to-analog converter (DAC) 46. Accordingly, the DAC 46 is receives the estimated temperature difference dT provided at the output of filter 42 and generates a respective analog temperature signal, which is provided as second protection signal PRE' at an output pin IWT. A microcontroller (such as microcontroller 50, see FIG. 9) or any other control circuitry connected to the output pin IWT may evaluate the analog temperature signal and trigger actions such as an alarm or an emergency shut-down of other components when the temperature difference indicated by the second protection signal PRE' exceeds a specific threshold. For example, the evaluation accomplished by the comparator 43' in the previous example of FIG. 13 may be now accomplished by the external controller (which may also be configured to select the value $dT_x$). For the further description of FIG. 14 reference is made to the description of FIG. 13.

Figure 16:
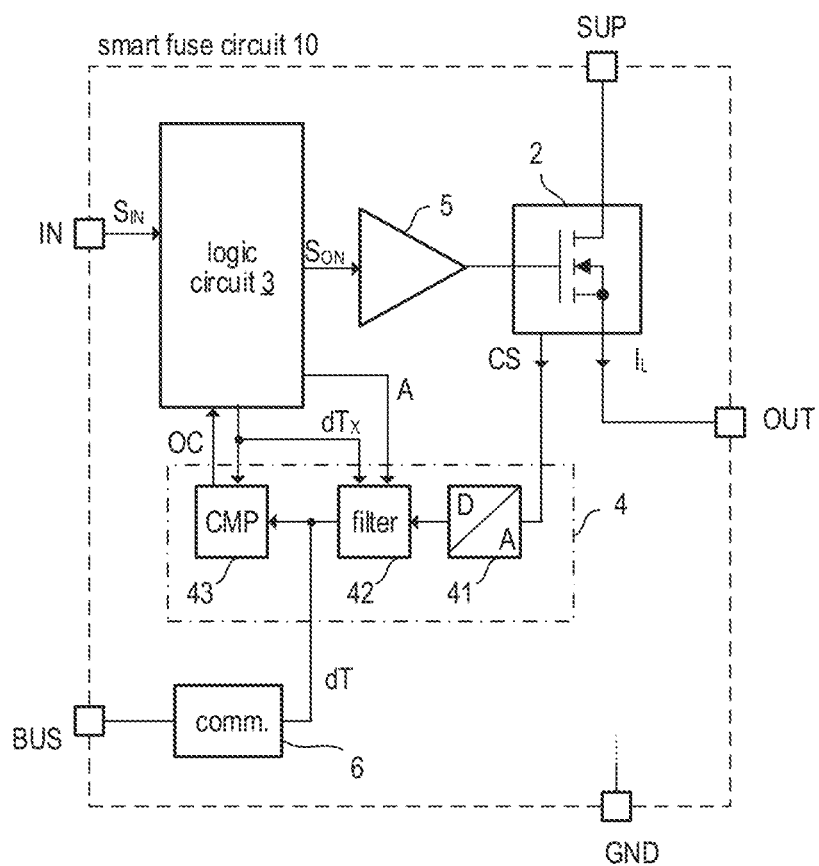
FIG. 16 illustrates a fourth example of another e-fuse ("smart fuse") circuit configured to provide a pre-warning signal.

The example of FIG. 16 is essentially identical with the previous example of FIG. 15 except that the estimated temperature difference dT provided at the output of filter 42 is not converted to an analog signal but rather communicated digitally to a controller or any other control circuitry via a digital bus interface 6. The bus may be, for example, a serial bus such as an SPI bus, an I²C bus, or the like. A microcontroller (such as microcontroller 50, see FIG. 9) or any other control circuitry connected digital bus interface 6 may evaluate the digital temperature information and trigger actions such as an alarm or an emergency shut-down of other components as explained above.

Figure 17:
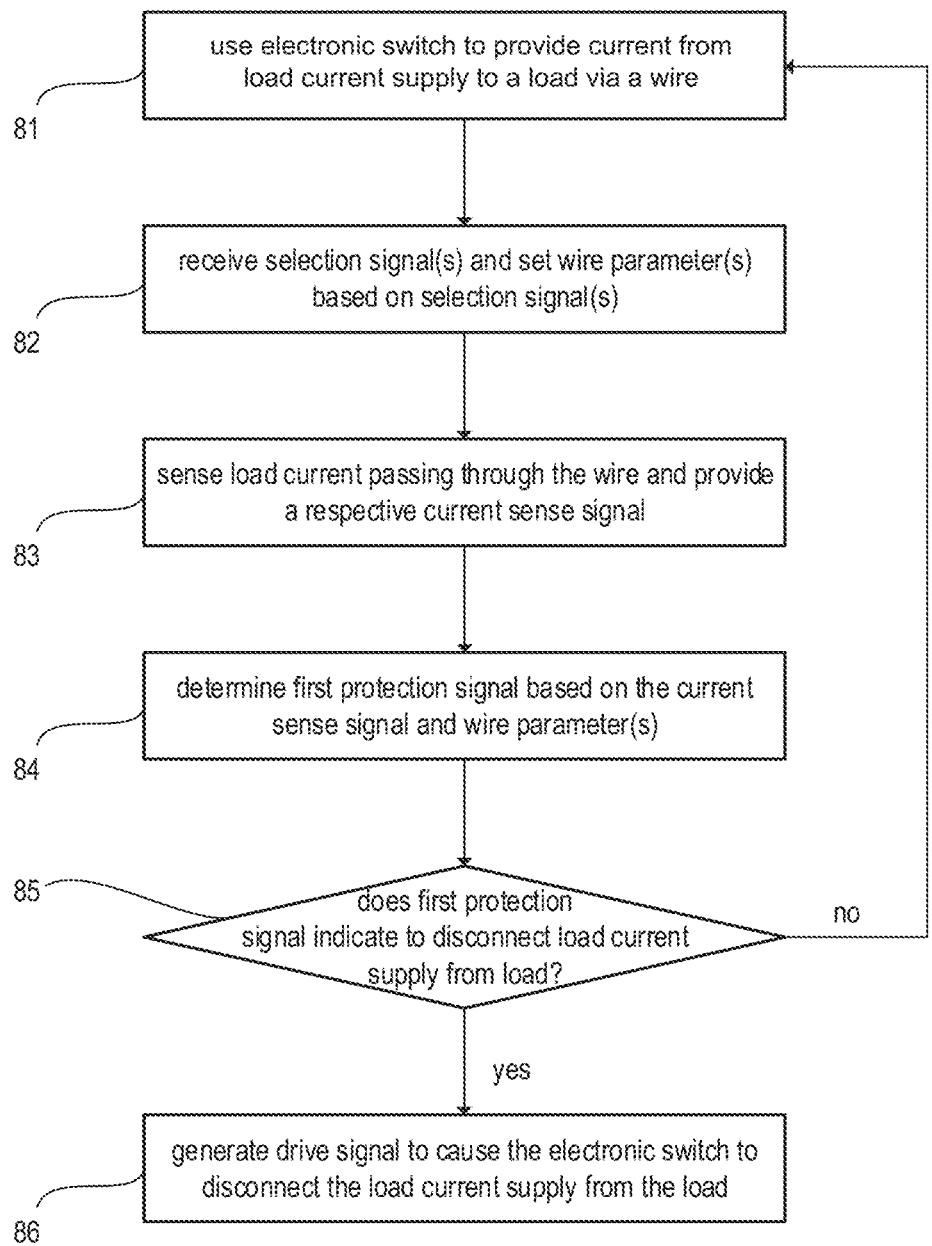
FIG. 17 is a flow chart illustrating one example of a method of operating an electronic switch.

FIG. 17 is a flow chart illustrating one exemplary method of operating an electronic switch as an electronic fuse. The method may be performed by any of the examples described herein (see, e.g., FIGS. 7-16). In the depicted example, the method includes using the electronic switch (e.g. FIGS. 7-8, electronic switch 2) to provide current from a load current supply node to a load via a wire (see FIG. 17, step 81). The method further includes receiving at least one selection signal (e.g. FIG. 7, signals $S_{S1}$, $S_{S2}$) and setting at least one wire parameter based on the at least one selection signal (see FIG. 17, step 82), and sensing a load current passing through the wire and providing a respective current sense signal (see FIG. 17, step 83; FIGS. 7-8 and 13-16, current sense signal CS). The method further includes determining a first protection signal based on the current sense signal and the at least one wire parameter (see FIG. 17, step 84), wherein the first protection signal is indicative of whether to block the load current supply to the load via the wire (FIGS. 7-8 and 13-16, protection signal OC). When the first protection signal indicates to block the load current supply to the load via the wire (see FIG. 17, step 85), a drive signal (FIGS. 7-8 and 13-16, signal $S_{ON}$) is generated for the electronic switch to cause the electronic switch to disconnect the load current supply node from the load (see FIG. 17, step 84). Various modifications, enhancements and exemplary implementations of the method have already been described further above with reference to FIGS. 5 to 16 and reference is thus made to the respective explanations.

Although the invention has been illustrated and described with respect to one or more implementations, alterations and/or modifications may be made to the illustrated examples without departing from the spirit and scope of the appended claims. In particular regard to the various functions performed by the above described components or structures (units, assemblies, devices, circuits, systems, etc.), the terms (including a reference to a "means") used to describe such components are intended to correspond—unless otherwise indicated—to any component or structure, which performs the specified function of the described component (e.g., that is functionally equivalent), even though not structurally equivalent to the disclosed structure, which performs the function in the herein illustrated exemplary implementations of the invention.

In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:
1. An electronic fuse circuit comprising:
an electronic switch having a load current path operably coupled to a load via a wire and configured to connect or disconnect a load current supply node and the load via the wire dependent on a drive signal;
a monitoring circuit configured to
receive a current sense signal representing a load current passing through the wire,
determine a first protection signal based on the current sense signal and at least one wire parameter comprising a reference temperature, the first protection signal being indicative of whether to disconnect the load current supply node from the load via the wire, wherein the first protection signal is generated when an estimated wire temperature reaches or exceeds the reference temperature,
determine a second protection signal based on the current sense signal, the second protection signal indicating whether the estimated wire temperature reaches or exceeds a further reference temperature that is lower than the reference temperature; and a logic circuit configured to receive the first protection signal and to generate the drive signal to cause the electronic switch to disconnect the load current supply node from the load, when the first protection signal indicates to disconnect the load current supply node from the load, wherein the logic circuit is further configured to receive at least one selection signal and to set the at least one wire parameter based on the at least one selection signal.

2. The electronic fuse circuit according to claim 1, wherein the at least one wire parameter includes a cross-sectional area of the wire.

3. The electronic fuse circuit according to claim 1, wherein the monitoring circuit is further configured to estimate a wire temperature to form the estimated wire temperature based on the current sense signal.

4. The electronic fuse circuit according to claim 3, wherein the reference temperature and the estimated wire temperature represent a temperature difference of the wire with respect to ambient temperature.

5. The electronic fuse circuit of claim 3, further comprising:
a digital-to-analog converter configured to receive a signal representing the estimated wire temperature and to generate a respective analog temperature signal; and
an output pin providing the analog temperature signal.

6. The electronic fuse circuit of claim 3, further comprising:
a digital communication interface configured to receive a signal representing the estimated wire temperature and configured to communicate information concerning the wire temperature via a bus.

7. The electronic fuse circuit of claim 3, further comprising:
a comparator configured to receive a signal representing the estimated wire temperature and to generate the second protection signal; and an output pin providing the second protection signal.

8. The electronic fuse circuit according to claim 1, wherein the monitoring circuit includes an analog-to-digital converter configured to receive the current sense signal and to provide a respective digital current sense signal.

9. The electronic fuse circuit according to claim 8, wherein the analog-to-digital converter has a logarithmic characteristic.

10. The electronic fuse circuit according to claim 1, wherein the monitoring circuit includes a filter, which is configured to generate, dependent on the current sense signal, a signal representing the estimated wire temperature.

11. The electronic fuse circuit according to claim 10, wherein the monitoring circuit includes an analog-to-digital converter configured to receive the current sense signal and to provide a respective digital current sense signal; and
wherein the filter is a digital filter and configured to receive the digital current sense signal and to generate the signal representing the estimated wire temperature dependent on the digital current sense signal.

12. The electronic fuse circuit according to claim 10, wherein a filter characteristic of the filter depends on the at least one wire parameter.

13. The electronic fuse circuit according to claim 10, wherein the monitoring circuit includes a comparator, which is configured to generate the first protection signal such that it indicates to disconnect the load current supply node from the load, when the estimated wire temperature reaches or exceeds the reference temperature.

14. The electronic fuse circuit according to claim 1, wherein the selection signal is one of: a voltage, a current, a digital signal.

15. The electronic fuse circuit according to claim 1, further comprising:
a digital communications interface operably coupled to a bus, wherein the logic circuit is further configured to receive the at least one selection signal via the digital communication interface.

16. The electronic fuse circuit according to claim 1, further comprising at least one input pin configured to receive the at least one selection signal, the logic circuit receiving the at least one selection signal via the at least one input pin.

17. The electronic fuse circuit according to claim 16, further comprising at least one resistor coupled between the at least one input pin and a circuit node providing a reference voltage, wherein the at least one selection signal is a current passing through the resistor.

18. The electronic fuse circuit according to claim 1, wherein the monitoring circuit is further configured to determine the second protection signal based on the current sense signal and the at least one wire parameter; and
wherein the monitoring circuit comprises a delay element configured to receive the second protection signal and to generate the first protection signal by delaying the second protection signal.

19. The electronic fuse circuit according to claim 18, further comprising an output pin providing the second protection signal.

20. A method for operating an electronic switch, the method comprising:
using the electronic switch to provide current from a load current supply node to a load via a wire;
receiving at least one selection signal setting at least one wire parameter based on the at least one selection signal;
sensing a load current passing through the wire and providing a respective current sense signal;
determining a first protection signal based on the current sense signal and the at least one wire parameter comprising a reference temperature, the first protection signal being indicative of whether to disconnect the load current supply node from the load, wherein determining the first protection signal comprises generating the first protection signal when an estimated wire temperature reaches or exceeds the reference temperature;
determining a second protection signal based on the current sense signal, the second protection signal indicating whether the estimated wire temperature reaches or exceeds a further reference temperature that is lower than the reference temperature; and
when the first protection signal indicates to disconnect the load current supply node from the load, generating a drive signal for the electronic switch to cause the electronic switch to disconnect the load current supply node from the load.

21. The method according to claim 20, wherein the at least one wire parameter includes a cross-sectional area of the wire.

22. The method of claim 20, wherein determining the first protection signal further comprises:

estimating a wire temperature to form the estimated wire temperature based on the current sense signal.

23. The method according to claim 22, wherein the reference temperature and the estimated wire temperature represent a temperature difference of the wire with respect to ambient temperature.

24. The method according to claim 22, wherein determining the first protection signal further comprises:
performing an analog-to-digital conversion of the current sense signal to provide a respective digital current sense signal,
wherein the analog-to-digital conversion is performed in accordance with a logarithmic characteristic.

25. The method according to claim 24, wherein determining the first protection signal further comprises digitally filtering the digital current sense signal to generate a signal representing the estimated wire temperature.

26. The method according to claim 25, wherein digitally filtering the digital current sense signal is done using a digital filter characteristic that depends on the at least one wire parameter.

27. The method of claim 22, further comprising:
converting the estimated wire temperature into an analog temperature signal; and
providing the analog temperature signal at an output pin.

28. The method of claim 22, further comprising communicating information concerning the wire temperature via a digital bus.

29. The method of claim 22, further comprising:
providing the second protection signal at an output pin.

30. The method according to claim 20, further comprising:
determining the second protection signal based on the current sense signal and the at least one wire parameter, wherein the first protection signal is generated by delaying the second protection signal; and
providing the second protection signal at an output pin.

31. An electronic fuse circuit comprising:
an electronic switch having a load current path operably coupled to a load via a wire and configured to connect or disconnect a load current supply node and the load via the wire dependent on a drive signal;
a monitoring circuit configured to receive a current sense signal representing a load current passing through the wire and to determine a first protection signal based on the current sense signal, the first protection signal being indicative of whether to disconnect the load current supply node from the load via the wire, and to estimate a wire temperature based on the current sense signal and to generate the first protection signal such that it indicates to disconnect the load current supply node from the load, when the estimated wire temperature reaches or exceeds a reference temperature;
a logic circuit configured to receive the first protection signal and to generate the drive signal such that is causes the electronic switch to disconnect the load current supply node from the load, when the first protection signal indicates to disconnect the load current supply node from the load, wherein the monitoring circuit is further configured to providing a pre-warning signal indicative of an imminent disconnection of the load current supply node from the load; and
a circuit configured to receive a signal representing the estimated wire temperature and to generate, as pre-warning signal, a signal indicating whether the estimated wire temperature reaches or exceeds a further reference temperature, which is lower than the reference temperature.

32. The electronic fuse circuit of claim 31, wherein the monitoring circuit is further configured to determine the pre-warning signal based on the current sense signal; and
wherein the monitoring circuit comprises a delay element configured to receive the pre-warning signal and to generate the first protection signal by delaying the pre-warning signal.

33. The electronic fuse circuit of claim 32, further comprising an output pin configured to provide the pre-warning signal.

34. The electronic fuse circuit of claim 31, further comprising a digital communication interface configured to receive a signal representing the estimated wire temperature and configured to communicate information concerning the wire temperature via a bus.

35. The electronic fuse circuit of claim 31, further comprising:
an output pin providing the pre-warning signal, wherein the circuit configured to receive the signal representing the estimated wire temperature comprises a comparator.

36. The electronic fuse circuit of claim 31, wherein the circuit configured to receive the signal representing the estimated wire temperature comprises a comparator.

37. An electronic fuse circuit comprising:
an electronic switch having a load current path operably coupled to a load via a wire and configured to connect or disconnect a load current supply node and the load via the wire dependent on a drive signal;
a monitoring circuit configured to receive a current sense signal representing a load current passing through the wire, to determine a first protection signal based on the current sense signal, the first protection signal being indicative of whether to disconnect the load current supply node from the load via the wire, to estimate a wire temperature based on the current sense signal and to generate the first protection signal such that it indicates to disconnect the load current supply node from the load, when the estimated wire temperature reaches or exceeds a reference temperature; and
a logic circuit configured to receive the first protection signal and to generate the drive signal such that is causes the electronic switch to disconnect the load current supply node from the load, when the first protection signal indicates to disconnect the load current supply node from the load, wherein the monitoring circuit is further configured to providing a pre-warning signal indicative of an imminent disconnection of the load current supply node from the load;
a digital-to-analog converter configured to receive a signal representing the estimated wire temperature and to generate a respective analog temperature signal; and
an output pin providing the analog temperature signal as pre-warning signal.

38. A method for operating an electronic switch, the method comprising:
using the electronic switch to provide current from a load current supply node to a load via a wire;
sensing a load current passing through the wire and providing a respective current sense signal;
estimating a wire temperature based on the current sense signal;

determining a first protection signal based on the current sense signal, the first protection signal being indicative of whether to disconnect the load current supply node from the load, wherein determining the first protection signal comprises generating the first protection signal when the estimated wire temperature reaches or exceeds a reference temperature;

providing a pre-warning signal indicative of an imminent disconnection of the load current supply node from the load, the pre-warning signal indicating whether the estimated wire temperature reaches or exceeds a further reference temperature that is lower than the reference temperature; and when the first protection signal indicates to disconnect the load current supply node from the load, generating a drive signal for the electronic switch to cause the electronic switch to disconnect the load current supply node from the load.

39. An electronic fuse circuit comprising:

an electronic switch having a load current path operably coupled to a load via a wire and configured to connect or disconnect a load current supply node and the load via the wire dependent on a drive signal;

a monitoring circuit configured to receive a current sense signal representing a load current passing through the wire and to determine a first protection signal based on the current sense signal and an estimated wire temperature, the first protection signal being indicative of whether to disconnect the load current supply node from the load via the wire;

a logic circuit configured to receive the first protection signal and to generate the drive signal to cause the electronic switch to disconnect the load current supply node from the load, when the first protection signal indicates to disconnect the load current supply node from the load, wherein the first protection signal is generated when the estimated wire temperature reaches or exceeds a reference temperature; and a digital-to-analog converter configured to receive a signal representing the estimated wire temperature and to generate a respective analog temperature signal;

wherein the logic circuit is further configured to receive at least one selection signal and to set the estimated wire temperature based on the at least one selection signal.

40. The electronic fuse circuit of claim 39, further comprising an output pin providing the analog temperature signal.

41. The electronic fuse circuit of claim 39, wherein the monitoring circuit is further configured to estimate a wire temperature to form the estimated wire temperature based on the current sense signal.

* * * * *